(12) United States Patent
Ivanenko et al.

(10) Patent No.: US 11,105,961 B2
(45) Date of Patent: Aug. 31, 2021

(54) APPARATUS FOR GENERATING A LINE-SHAPED INTENSITY DISTRIBUTION OF A LASER RADIATION

(71) Applicant: LIMO GmbH, Dortmund (DE)

(72) Inventors: Mikhail Ivanenko, Essen (DE); Viacheslav Grimm, Sankt Petersburg (RU)

(73) Assignee: LIMO DISPLAY GmbH, Dortmund (DE)

( * ) Notice: Subject to any disclaimer, the term of this patent is extended or adjusted under 35 U.S.C. 154(b) by 140 days.

(21) Appl. No.: 16/035,034

(22) Filed: Jul. 13, 2018

(65) Prior Publication Data

US 2019/0018168 A1    Jan. 17, 2019

(30) Foreign Application Priority Data

Jul. 14, 2017    (DE) .......................... 102017115964.9

(51) Int. Cl.
*G02B 27/00* (2006.01)
*G02B 1/12* (2006.01)
(Continued)

(52) U.S. Cl.
CPC ............ *G02B 1/12* (2013.01); *B23K 26/0604* (2013.01); *B23K 26/0738* (2013.01);
(Continued)

(58) Field of Classification Search
CPC .. G02B 1/12; G02B 27/0961; G02B 27/0966; G02B 27/0927; G02B 27/0911;
(Continued)

(56) References Cited

U.S. PATENT DOCUMENTS 5,331,466 A     7/1994  Van Saarloos
5,461,473 A *  10/1995  Pratt .................... G01C 15/002
                                                        250/206.1
(Continued)

FOREIGN PATENT DOCUMENTS

DE      102007044298 B3    2/2009
DE      102008033358 A1    2/2009
(Continued)

OTHER PUBLICATIONS

Search Report in corresponding Taiwan Patent Application No. 107122629, dated May 18, 2019, with English translation.
(Continued)

*Primary Examiner* — Y M. Quach Lee
(74) *Attorney, Agent, or Firm* — Edell, Shapiro & Finnan, LLC

(57) ABSTRACT

An apparatus for generating a line-shaped intensity distribution of laser radiation comprises first and second beam transformation devices spaced apart from one another and at least one focusing element to focus laser radiation that has passed through the first and second beam transformation devices into a line-shaped intensity distribution. The apparatus is configured to change the line width of the line-shaped intensity distribution in a line transverse direction by changing a distance between the first and second beam transformation devices.

10 Claims, 4 Drawing Sheets

(51) Int. Cl.
*G02B 27/09* (2006.01)
*H01S 5/40* (2006.01)
*B23K 26/073* (2006.01)
*B23K 26/06* (2014.01)
*G02B 5/10* (2006.01)
*G02B 3/00* (2006.01)

(52) U.S. Cl.
CPC ..... *G02B 27/0927* (2013.01); *G02B 27/0961* (2013.01); *G02B 27/0966* (2013.01); *H01S 5/4025* (2013.01); *G02B 3/0006* (2013.01); *G02B 5/10* (2013.01); *G02B 27/0911* (2013.01)

(58) Field of Classification Search
CPC .... G02B 3/0006; G02B 5/10; G02B 27/0944; G02B 19/0095; G02B 19/0057; G02B 19/0052; G02B 19/0028; G02B 19/0014; B23K 26/0738; B23K 26/0604; H01S 5/4025

See application file for complete search history.

(56) References Cited

U.S. PATENT DOCUMENTS

| | | | |
|---|---|---|---|
| 5,721,416 A * | 2/1998 | Burghardt | B23K 26/0738 219/121.73 |
| 6,773,142 B2 | 8/2004 | Rekow | |
| 6,894,839 B2 | 5/2005 | Sugiyama et al. | |
| 7,559,671 B2 * | 7/2009 | Lee | G02B 27/0994 353/98 |
| 2006/0291020 A1 * | 12/2006 | Knox | G02B 5/0215 359/15 |
| 2007/0109784 A1 * | 5/2007 | Kosnik | G02B 5/32 362/260 |
| 2012/0013880 A1 | 1/2012 | Choi et al. | |

FOREIGN PATENT DOCUMENTS

| | | | | |
|---|---|---|---|---|
| DE | 10200757868 A1 | 6/2009 | | |
| DE | 102013225310 B3 | 5/2015 | | |
| JP | 2002-25933 A | 1/2002 | | |
| JP | 2011-216863 A | 10/2011 | | |
| TW | I279052 B | 4/2007 | | |
| TW | I575828 B | 3/2017 | | |
| WO | WO 2007/048506 A1 * | 5/2007 | ............ | G02B 27/00 |
| WO | WO 2015/138476 A2 * | 9/2015 | ............ | G02B 19/00 |
| WO | WO 2017/029874 A1 * | 2/2017 | ............ | H01S 5/022 |

OTHER PUBLICATIONS

Office Action in corresponding Japanese Patent Application No. 2018-133707, dated Jul. 16, 2019, in English language.

* cited by examiner

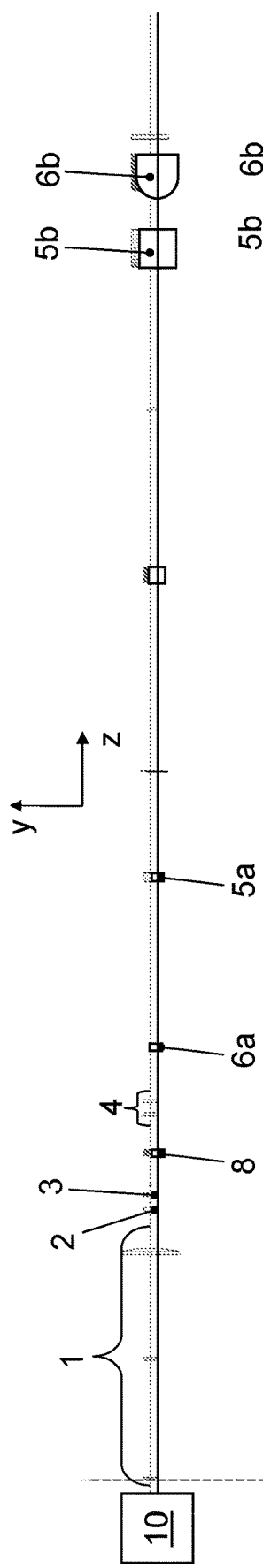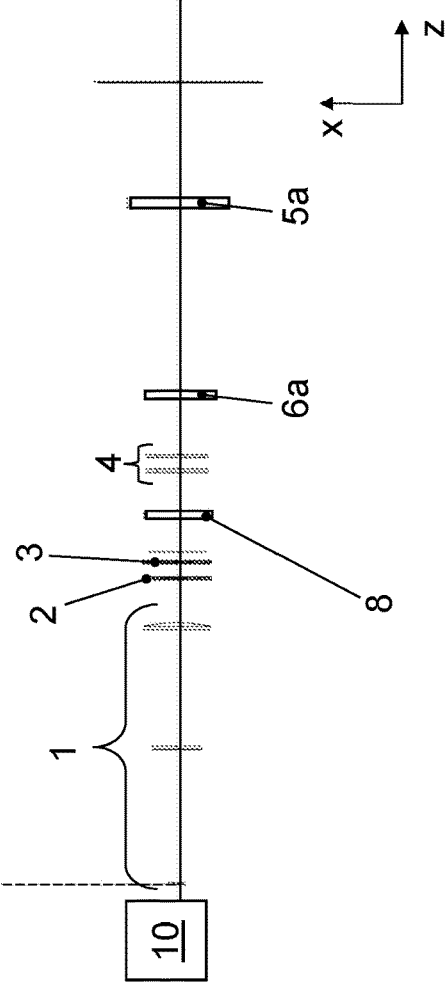

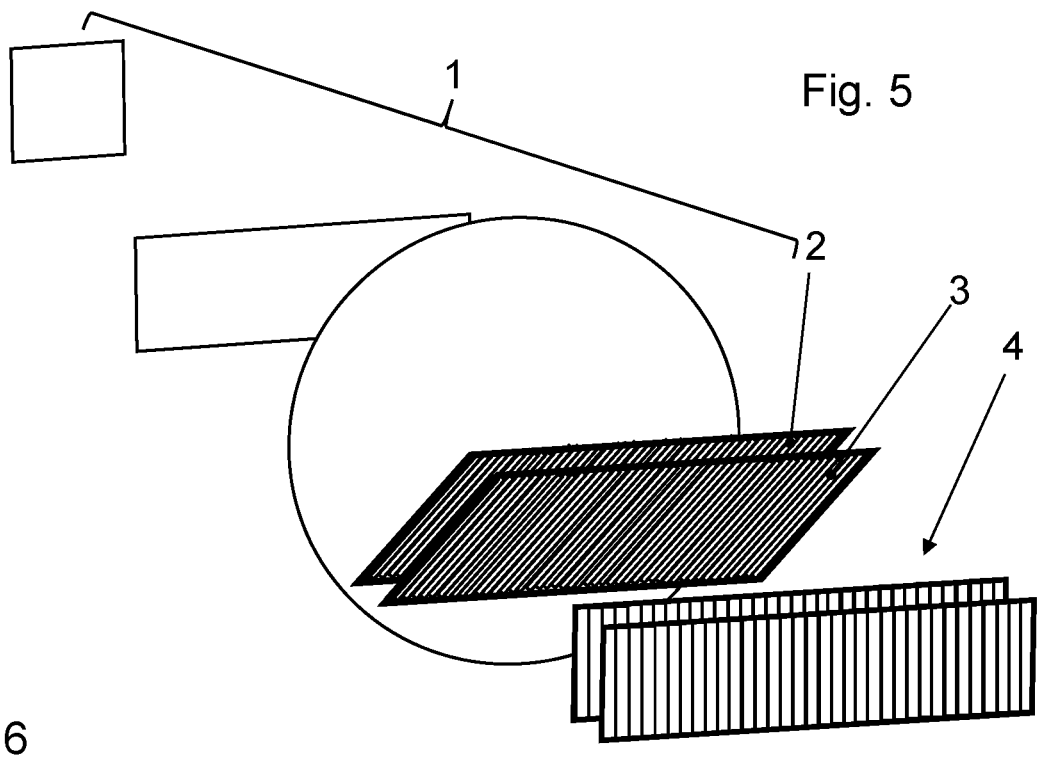
Fig. 5
Fig. 6
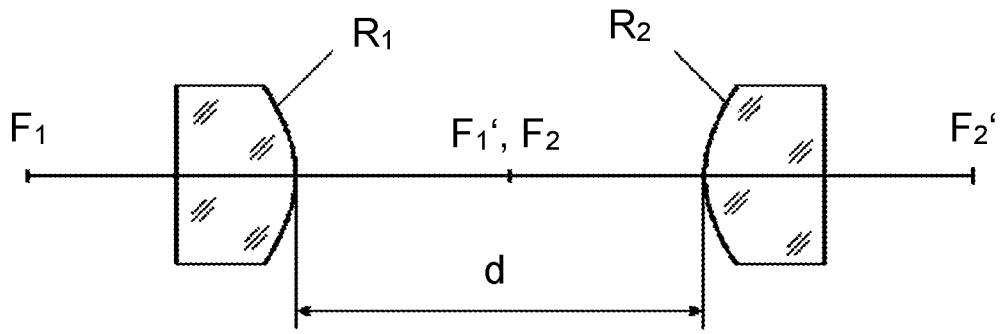
Fig. 7
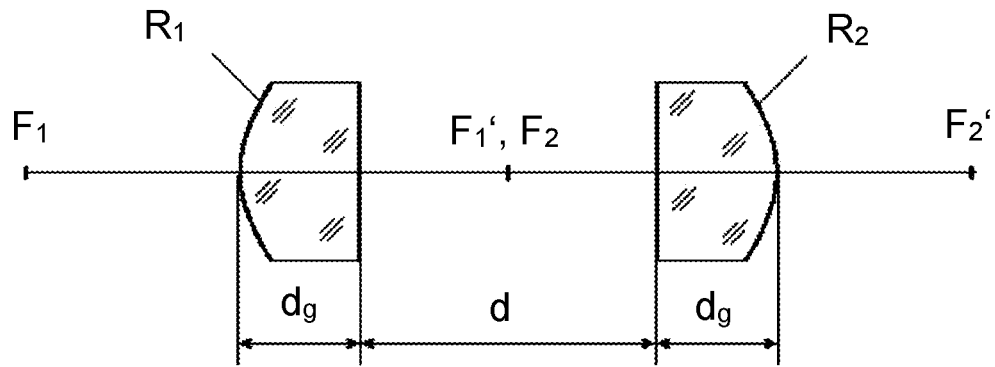

APPARATUS FOR GENERATING A LINE-SHAPED INTENSITY DISTRIBUTION OF A LASER RADIATION

CROSS REFERENCE TO RELATED APPLICATIONS

This application claims foreign priority under 35 U.S.C. § 119(a)-(d) to Application No. DE 102017115964.9 filed on Jul. 14, 2017, the entire contents of which are hereby incorporated by reference.

TECHNICAL FIELD

The present invention relates to an apparatus for generating a line-shaped intensity distribution of a laser radiation.

BACKGROUND

In order to generate long, homogeneous and narrow laser lines with a particularly large depth of field, it is possible to use refractive or reflective beam transformation devices that rearrange the mode combination of multi-mode lasers ($M^2>10$), for example, of solid state lasers, such that the beam quality (or, more specifically, the diffraction index or the mode number or the beam divergence) significantly decreases for a transverse direction (Y) and increases for the other direction (X). As a result, the radiation in the X direction (long line axis) can be homogenized very well with optics disposed behind the beam transformation devices. In the Y direction (line cross section) the radiation can be focused very well, and a large depth of field can be achieved. It is also advantageous that a large working distance can be achieved with simply designed, focusing optics with low numerical aperture (NA). A commensurate apparatus may be found in the document EP 1 896 893 A1.

Refractive beam transformers consisting of two lens arrays are known from the document U.S. Pat. No. 5,513,201. The refractive beam transformers are used to bundle the radiation of a laser diode array. The document EP 1 006 382 A1 discloses another beam transformer with two biconvex cylindrical lens arrays.

SUMMARY

The problem on which the present invention is based is to provide an apparatus for generating a line-shaped intensity distribution of a laser radiation such that the line width in line transverse direction of the line-shaped intensity distribution can be affected.

It is provided that the apparatus be designed such that the line width in line transverse direction of the line-shaped intensity distribution can be changed by changing the distance between the two beam transformation devices. This aspect allows the line width in line transverse direction of the line-shaped intensity distribution to be affected in a simple way.

The result is, in particular, a continuous and technically easily realizable control of the line width when shaping narrow laser lines with multi-mode lasers, such as, for example, of a solid state laser. In this way it is also possible to optically compensate for manufacturing tolerances of the beam transformation devices as well as for manufacturing faults and adjustment errors of optical elements between the laser light source and the beam transformation devices, which affect the divergence in the X direction, as well a laser divergence, which deviates from the design of the apparatus.

In addition, it is also possible to reduce the light intensity in the beam transformation devices such that the light intensity is below the damage threshold of the material used.

BRIEF DESCRIPTION OF THE DRAWINGS

Other features and advantages of the present invention will become apparent from the following description of preferred exemplary embodiments with reference to the accompanying drawings, in which:

FIG. 1a shows in schematic form a side view of an embodiment of an apparatus according to the invention;

FIG. 1b shows in schematic form a plan view of the apparatus according to FIG. 1a;

FIG. 5 shows in schematic form a perspective view of one portion of the apparatus;

FIG. 6 shows a section of a first embodiment of beam transformation devices;

FIG. 7 shows a section of a second embodiment of beam transformation devices;

Identical or functionally identical parts are provided with the same reference numerals in the figures. In this case Cartesian coordinate systems are drawn into some of the figures, in order to facilitate orientation.

DETAILED DESCRIPTION

Figure 2:
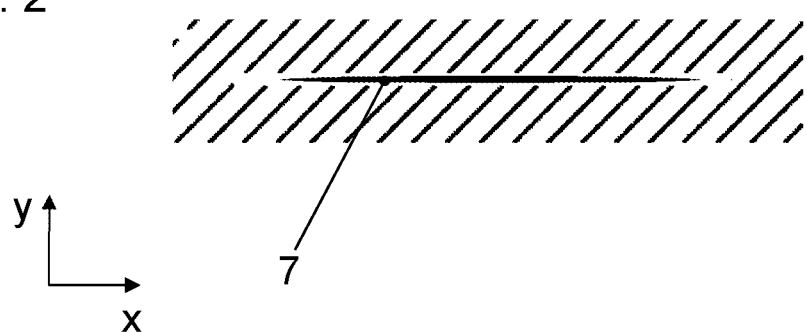
FIG. 2 shows a view of the cross section of the laser radiation on the entry surface of the first of the two beam transformation devices.

The line-shaped intensity distribution to be generated for a laser radiation exhibits a line longitudinal direction, which extends in an X direction, and a line transverse direction, which extends in a Y direction, in the Cartesian coordinate systems.

The apparatus, depicted in FIG. 1a and FIG. 1b, comprises a laser light source 10 (depicted only in schematic form), an anamorphotic telescope 1, first and second beam transformation devices 2, 3 as well as a homogenizer 4, which act, in particular, on the X direction or, more specifically, the line longitudinal direction. Furthermore, the apparatus comprises Fourier optical elements 5a, 5b for the X direction and focusing elements 6a, 6b for the Y direction.

The laser light source 10 may be designed, for example, as a solid state laser pumped by laser diodes. The homogenizer 4 may comprise, for example, two arrays of cylindrical lenses, the cylinder axis of which extend in the Y direction, with the arrays being arranged one behind the other in the propagation direction of the laser radiation or, more specifically, in the Z direction.

The anamorphotic telescope 1 is used to shape a narrow elliptical waist 7 in the long axis X on the entry surface of the first beam transformation device 2 (see FIG. 2 in this respect). The beam transformation devices 2, 3 may be designed as two refractive or reflective arrays.

Optical element 8, which acts on the X direction, may be provided behind the beam transformation devices 2, 3 and in front of the homogenizer 4.

Figure 3A:
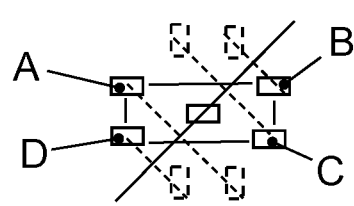
FIGS. 3a and 3b show drawings to elucidate the beam transformation.
Figure 3B:
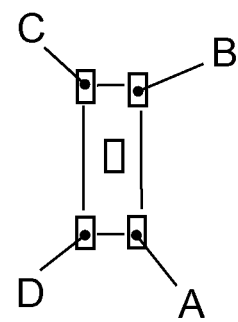
Figure 4A:
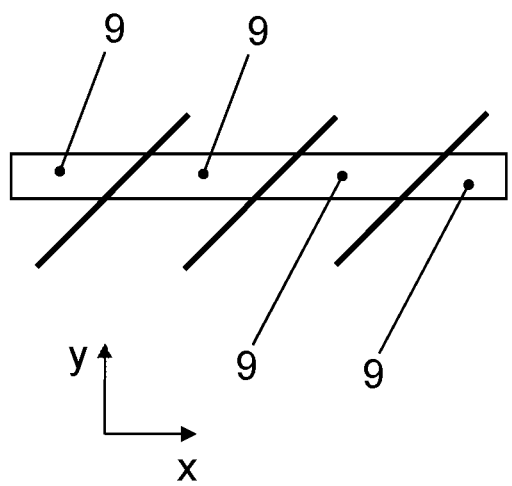
FIG. 4a shows a schematic view of the cross section of the laser radiation on the entry surface of the first of the two beam transformation devices.
Figure 4B:
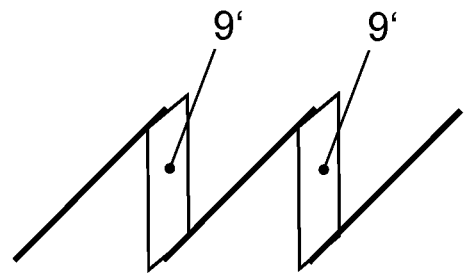
FIG. 4b shows a schematic view of the cross section of the laser radiation on the emergence surface of the second of the two beam transformation devices.

Each of the beam transformation devices 2, 3 comprises, for example, a refractive array. At the first array, the elliptical waist 7 is divided into a plurality of partial beams, in particular, into m, partial beams 9 or, more specifically, segments in the X direction. As an alternative, the laser radiation may be divided with an additional segmenting optics in front of the arrays. Moreover, the partial beams 9 are transformed such that they are reflected relative to a 45° axis in the X-Y plane at the output of the beam transformation devices 2, 3, as compared to the input. In FIGS. 3a and 3b this feature is indicated by the transformation of the corners A, B, C, D of the cross section of a partial beam 9. FIG. 4a shows partial beams 9 that are still adjacent to one another at the input, and FIG. 4b shows transformed partial beams 9' at the output.

In the space between the arrays the partial beams are focused to a certain degree.

The transformation changes the diffraction index $M^2$ anisotropically for the light bundle. In this case $M^2$ is reduced, in particular, m times for the Y direction and enlarged m times for the X direction. It can also be depicted such that the small input divergence $\theta_x$ with respect to the X direction or, more specifically, the long axis of the elliptical waist 7, on the one hand, and the large input divergence $\theta_y$ with respect to the Y direction or, more specifically, the narrow axis of the elliptical waist 7 are reversed after the transformation.

$$\theta_x \to \theta'_y, \theta_y \to \theta'_x \quad (1)$$

Figure 10:
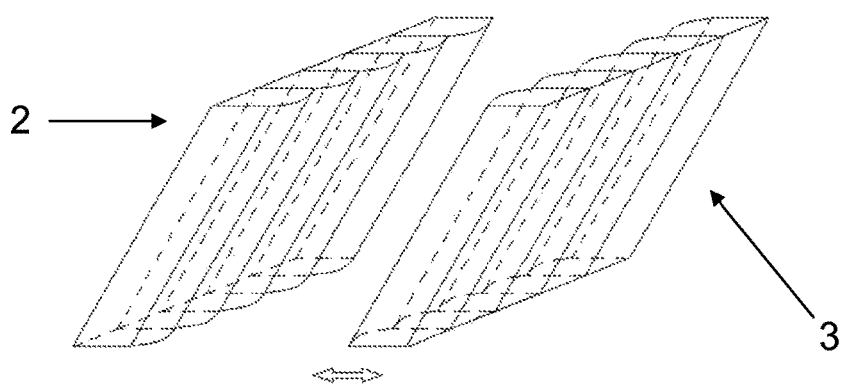
FIG. 10 shows a perspective view of the two beam transformation devices.

A preferred embodiment of the beam transformation devices 2, 3 consists of two arrays of cylindrical lenses, of which the cylinder axes are aligned at an angle of 45° to the X direction and to the Y direction (see in this respect FIG. 2, FIG. 5, and FIG. 10). In this case, the cylinder axes of the array, forming the first beam transformation device 2, are aligned parallel to the cylinder axes of the array, forming the second beam transformation device 3.

The individual pairs of cylindrical lenses of the arrays form for the partial beams Keppler telescopes with a magnification −1:

$$\frac{d}{2} = \frac{R_1}{n-1} \quad (2)$$

$$R_1 = -R_2 = \frac{n-1}{d} \cdot d$$

$$k_1 = k_2 = -n^2$$

The equations (2) apply only to the embodiment in accordance with FIG. 6. The embodiment in accordance with FIG. 6 has the advantage that the energy density on the inner lens surfaces is less than in the embodiment in accordance with FIG. 7. In FIG. 6 and FIG. 7, the radii of the lens surfaces of the first and the second beam transformation devices 2, 3 are marked $R_1$ and $R_2$ respectively. The letter d denotes the distance between the lens surfaces that lie opposite one another. In FIG. 6 and FIG. 7, $F_1$, $F_{140}$, $F_2$, $F_2'$ denote the front and rear focal lengths of the cylindrical lenses. In FIG. 7, $d_g$ denotes the thicknesses of the cylindrical lenses.

In principle, an embodiment with crossed step mirrors having concave steps is possible. However, the concave steps should have a suitable shape, in order to be able to compensate for aberrations.

The beam divergence at the output according to equation (1) applies, if the distance d between the lens arrays is selected such that the telescopic conditions, for example, according to equation (2) for the configuration in accordance with FIG. 6, are fulfilled exactly.

By fine tuning the distance d, it is possible, on the one hand, to change the divergence of the output beams. On the other hand, the manufacturing faults of the radius can be corrected. Furthermore, it is possible to optically compensate for the manufacturing faults and the adjustment errors of optical elements between the laser light source and the beam transformation devices, which affect the divergence in the X direction, as well as also a laser divergence that deviates from the design of the apparatus.

When the distance $\Delta = d - d_0$ changes, an additional divergence is imparted to the partial beams 9, 9' after the transformation devices 2, 3:

$$\delta\theta = -\Delta * P/(2f_T^2), \quad (3)$$

where P is the pitch or, more specifically, the average distance between the cylindrical lenses of the beam transformation device 2, 3 perpendicular to the cylinder axes, and $f_T$ is the focal length of the cylindrical lenses of the beam transformation device 2, 3.

The resulting divergence for Y $$\theta'_y + \delta\theta \quad (4)$$

increases as the distance decreases. As the distance increases or, more specifically, when $\Delta$ is positive, the divergence decreases initially. Then on reaching the value $\delta\theta = -\theta'_y$, the divergence begins to increase again (formally with "−" sign).

The movement of the two beam transformation devices 2, 3 relative to one another is indicated in FIG. 10.

Figure 8:
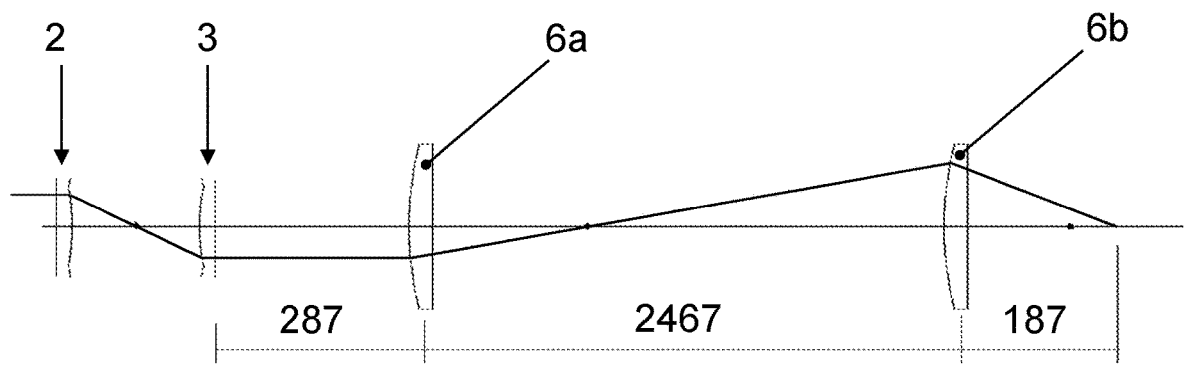
FIG. 8 shows an optical path through the two beam transformation devices and focusing elements, where the optical path is not drawn true to scale and is shown only as an example.

The line width $w_y$ is a function of the divergence, which shall be explained by the following example:

Given is a beam transformation device with a pitch P=1.06 mm, $f_T$=7.5 mm, $\theta'_y$=0.25 mrad; a focusing lens, which is used as the first focusing element 6a, where $f_1$=586 mm; and a projection lens, which is used as the second focusing element 6b, where $f_2$=170 mm and where the magnification is V=S'/S=(2,467−586)/187=1/10.06 (see FIG. 8). The measurements given in FIG. 8 are distances in mm.

Figure 9:
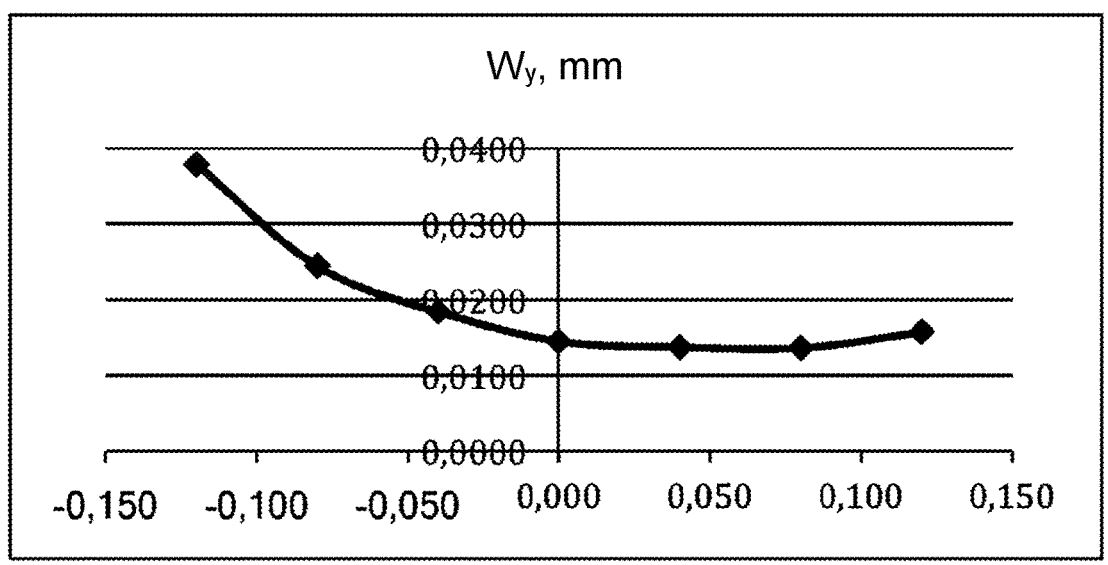
FIG. 9 shows a graph that depicts the dependence of the beam waist in line transverse direction as a function of the distance between the two beam transformation devices.

The change in the distance of the beam transformation devices in the range $\Delta$=+0.04 . . . −0.12 mm changes the line width $w_y$=HW@$e^{-2}$ from 14 μm to 38 μm (see FIG. 9). Such a shift is easily possible with suitable precision mechanisms. Precise electro-mechanical, for example, piezo drives are also very suitable for this purpose.

What is claimed is:

1. An apparatus for generating a line-shaped intensity distribution of laser radiation, the apparatus comprising:
   a laser light source that emits laser radiation in a propagation direction;
   first and second beam transformation devices spaced apart from one another; and
   at least one focusing element to focus laser radiation that has passed through the first and second beam transformation devices into a line-shaped intensity distribution, wherein the apparatus is configured to change the line width of the line-shaped intensity distribution in a line transverse direction by changing a distance between the first and second beam transformation devices, and wherein at least one of the first and second beam transformation devices is configured to transform the laser radiation such that the divergence or the diffraction index of two transverse directions of the laser radiation is reversed, with the transverse directions being perpendicular to one another.

2. The apparatus of claim 1, wherein at least one of the first and second beam transformation devices comprises a lens array or a mirror array.

3. The apparatus of claim 2, wherein, in the lens array, the lenses are cylindrical lenses having cylinder axes that are aligned at an angle of 45° to the direction in which the lenses are arranged side by side.

4. The apparatus of claim 2, wherein, in the mirror array, the mirrors exhibit a concave curvature.

5. The apparatus of claim 1, further comprising:
a laser light source comprising a solid state laser pumped by laser diodes.

6. The apparatus of claim 5, further comprising:
an anamorphotic telescope arranged between the laser light source and the first and second beam transformation devices.

7. The apparatus of claim 1, further comprising:
a homogenizer arranged between the at least one focusing element and the first and second beam transformation devices.

8. The apparatus of claim 1, further comprising:
a positioning mechanism to change the distance between the first and second beam transformation devices such that one of the first and second beam transformation devices is moved relative to the other of the first and second beam transformation devices.

9. The apparatus of claim 8, wherein the positioning mechanism comprises an electro-mechanical drive.

10. The apparatus of claim 9, wherein the electro-mechanical drive comprises a piezo drive.

* * * * *